(12) United States Patent
Lee

(10) Patent No.: US 7,615,396 B1
(45) Date of Patent: Nov. 10, 2009

(54) PHOTODIODE STACK FOR PHOTO MOS RELAY USING JUNCTION ISOLATION TECHNOLOGY

(75) Inventor: Eugene Ching Lee, 630 Harrisburg Pl., San Jose, CA (US) 95133

(73) Assignee: Eugene Ching Lee, San Jose, CA (US)

( * ) Notice: Subject to any disclaimer, the term of this patent is extended or adjusted under 35 U.S.C. 154(b) by 0 days.

(21) Appl. No.: 12/150,383

(22) Filed: Apr. 28, 2008

(51) Int. Cl.
*H01L 31/00* (2006.01)
(52) U.S. Cl. ............... 438/57; 257/E31.095; 257/461
(58) Field of Classification Search ............. 438/48, 438/57; 257/414, 461, 462, 463, 464, 465, 257/459, E31.095
See application file for complete search history.

(56) References Cited

U.S. PATENT DOCUMENTS

| 3,551,761 | A | * | 12/1970 | Ruoff et al. ................. 257/443 |
| 4,873,202 | A | | 10/1989 | Akiyama |
| 5,151,602 | A | | 9/1992 | Idaka et al. |
| 5,299,046 | A | * | 3/1994 | Spaeth et al. ............... 398/135 |
| 6,271,943 | B1 | | 8/2001 | Goossan |
| 6,750,523 | B2 | * | 6/2004 | Blanchard ................... 257/461 |
| 6,806,482 | B2 | | 10/2004 | Yamagishi |
| 6,987,268 | B2 | * | 1/2006 | Kuijk et al. ............ 250/370.01 |

* cited by examiner

*Primary Examiner*—Matthew Smith
*Assistant Examiner*—Michele Fan

(57) ABSTRACT

A novel photodiode stack which comprising of more than 3 photodiodes connected in series to produce a large photovoltaic voltage in the presence of light using junction isolation technology.

1 Claim, 5 Drawing Sheets

PHOTODIODE STACK FOR PHOTO MOS RELAY USING JUNCTION ISOLATION TECHNOLOGY

BACKGROUND OF THE INVENTION

1. Field of the Invention

This invention is related to the design and manufacturing of the photodiode stack uses to produce photo MOS relay, also known as solid state relay or semiconductor relay.

2. Description of the Related Art

Any discussion of the prior art throughout the specification should in no way be considered as an admission that such prior art is widely known or form part of common general knowledge in the field.

A photo MOS relay is an Opto semiconductor device functioning like an electromechanical relay. Depending on the type of output MOS device uses, a photo MOS relay can be made either normally open or normally close. FIG. 1 shows an electrical block diagram of a normally open photo MOS relay. The input of a photo MOS relay is an infrared light emitting diode (LED). The output side of a photo MOS relay consists of a photovoltaic circuit and two MOS transistors. The photovoltaic circuit consists of a photodiode stack, turn on and off control circuits which normally are all fabricated on the same silicon substrate. Wire bonding is performed between the photovoltaic circuit to the gate and source terminals of the two MOS transistors. The input side and the output side of a photo MOS relay is separated by an electrically insulated material which is transparent to infrared light. The input LED, the insulation and light transmission medium, the photovoltaic circuit and the two MOS transistors are encased in molded plastic or ceramic package to produce a photo MOS relay device. When the input LED is carrying current, it emits infrared light. The infrared light shins on the photodiode stack and generates a photo current in the photo diode and a rise in voltage between the terminals of the photodiode stack. The photodiode stack voltage applies to the gate and source terminals of the two MOS transistors. If the MOS transistor is an enhancement type, the MOS transistors will turn on to emulate a closing of a normally open switch. If the MOS transistor is a depletion type, the MOS transistor will turn off to emulate an opening of a normally close switch.

The voltage generates across the photodiode stack in the present of infrared light mainly depends on the number of photo diodes in the stack. In a typical photo MOS relay, the number photo diode in the photodiode stack range from 14 to more than 20 photo diodes. In the prior art, the photodiode stack, the turn on and off control circuit components are fabricated using oxide isolation technology. The use of oxide isolation technology is mentioned in numerous US and international patents, ie. U.S. Pat. Nos. 6,806,482, 5,151,602, 4,873,202, . . . FIG. 2 and FIG. 3 show the top and cross section views on a section of the photo diodes stack build with oxide isolation technology. Each diode is resided in its own oxide isolated pocket so there is no concern regarding junction to substrate leakage or issue with deep junction photo current generation. While the oxide isolation technology is effective in producing the photodiode stack, the major drawbacks are the higher cost of fabrication, longer fabrication cycle time and difficulty in locating wafer foundry as oxide isolation fabrication technology is a niche and specialize process which very few companies have. Since the turn on and off control circuits are on the same substrate as the photodiode stack, the circuit components of the turn on and off circuits are fabricated on the expensive oxide isolated substrate. Due to the high cost relates to the oxide isolated technology, higher degree of circuit integration to the photovoltaic circuit is not economically feasible. In U.S. Pat. No. 6,750,523, a mean of producing the photodiode stack using standard junction isolation Bipolar or CMOS technology is described. However, the described method uses the substrate as a conductive path and nest diffusions to form the photo diode which limits the maximum number of photo diodes to 3 to 4. Since the photo current produces in the photodiode is on the order of a couple micro ampere, 3 to 4 photo diodes in series will generate about 1.5V to 2V at room temperature when the LED is carrying current. The voltage generates by 3 or 4 photo diodes in series is not high enough for photo MOS relay application. As mentioned earlier, 14 or more diodes in series are needed for typical photo MOS relay design due to the output MOS's input threshold voltage plus the gate to source over drive voltage requirements to conduct the relay's rated load current. Also, the diode's forward voltage of the photodiode stack has a negative temperature coefficient of about −2 mV/degree C. so the photodiode stack voltage must remain high enough for photo MOS relay high temperature operation. A photo MOS relay has many advantages over the traditional electromechanical relay like higher reliability due to no moving parts, smaller physical size, no relay bounce, lower input operating current and longer operation life. However, the main disadvantage for photo MOS relay compares to electromechanical relay is higher product cost. A major contributor to the higher cost of a photo MOS relay is due to the photodiode stack is fabricated using oxide isolation technology. Thus, a method of generating photodiode stack using lower cost junction isolation technology is highly desirable for photo MOS relay production.

BRIEF SUMMARY OF THE INVENTION

The present invention describes a method of producing a photodiode stack suitable for photo MOS relay design using junction isolation technology. FIG. 4 and FIG. 5 shows the cross section view and circuit equivalent schematic of an embodiment of the present invention. By properly connecting the silicon diffusion junctions to keep the substrate reverse bias, multiple photodiodes can be made on the same substrate. Metal layer light shield is placed at the strategic locations on top of the silicon to prevent unwanted photo current generation. Depending on the wavelength of the input infrared LED, proper junction diffusion depth is used to maximize the photo current generation at the active region of the photodiode while minimize the effect of the deep junction photo current generation.

DETAIL DESCRIPTION OF THE INVENTION

Figure 1:
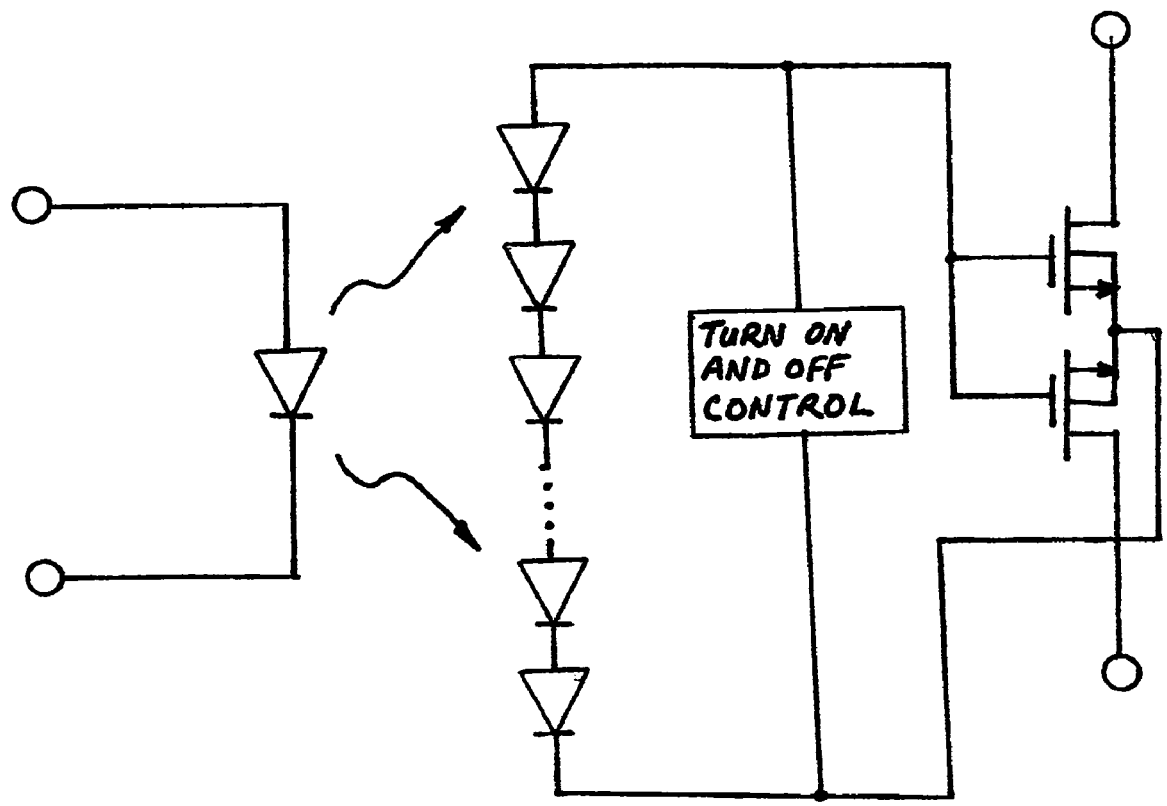
FIG. 1 is a circuit diagram of a photo MOS relay.
Figure 2:
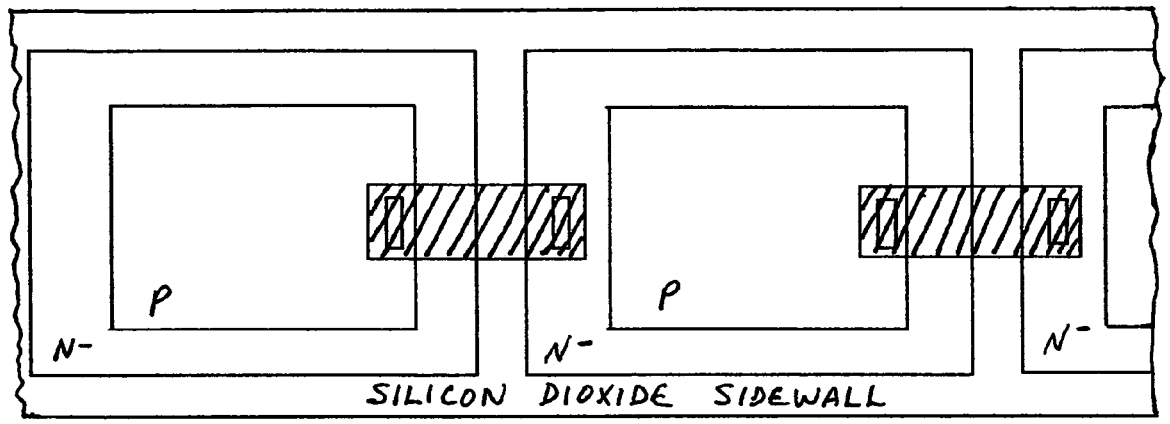
FIG. 2 is a top view of prior art photodiode stack using oxide isolated technology.
Figure 3:
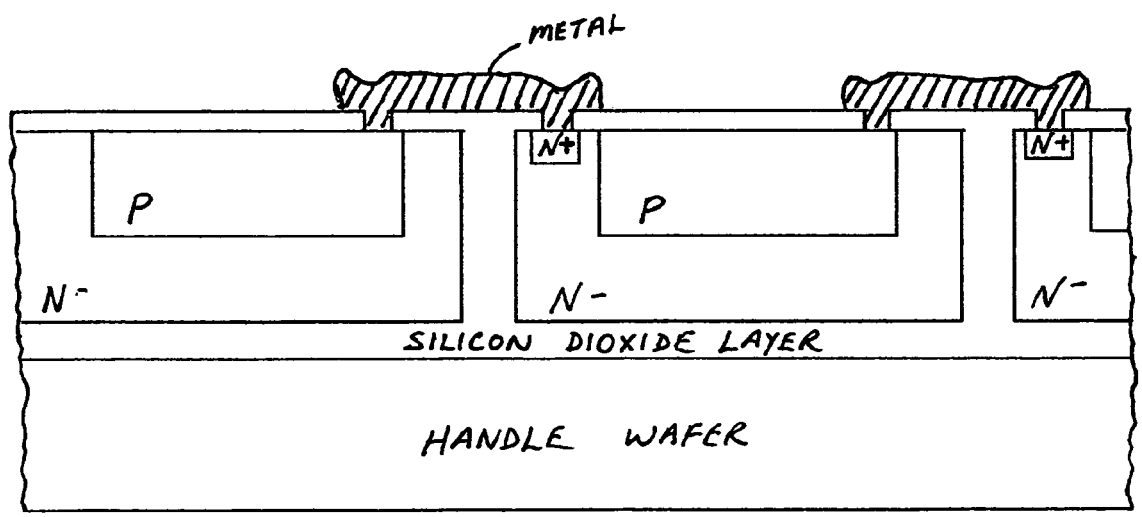
FIG. 3 is a side view of prior art photodiode stack using oxide isolated technology.
Figure 4:
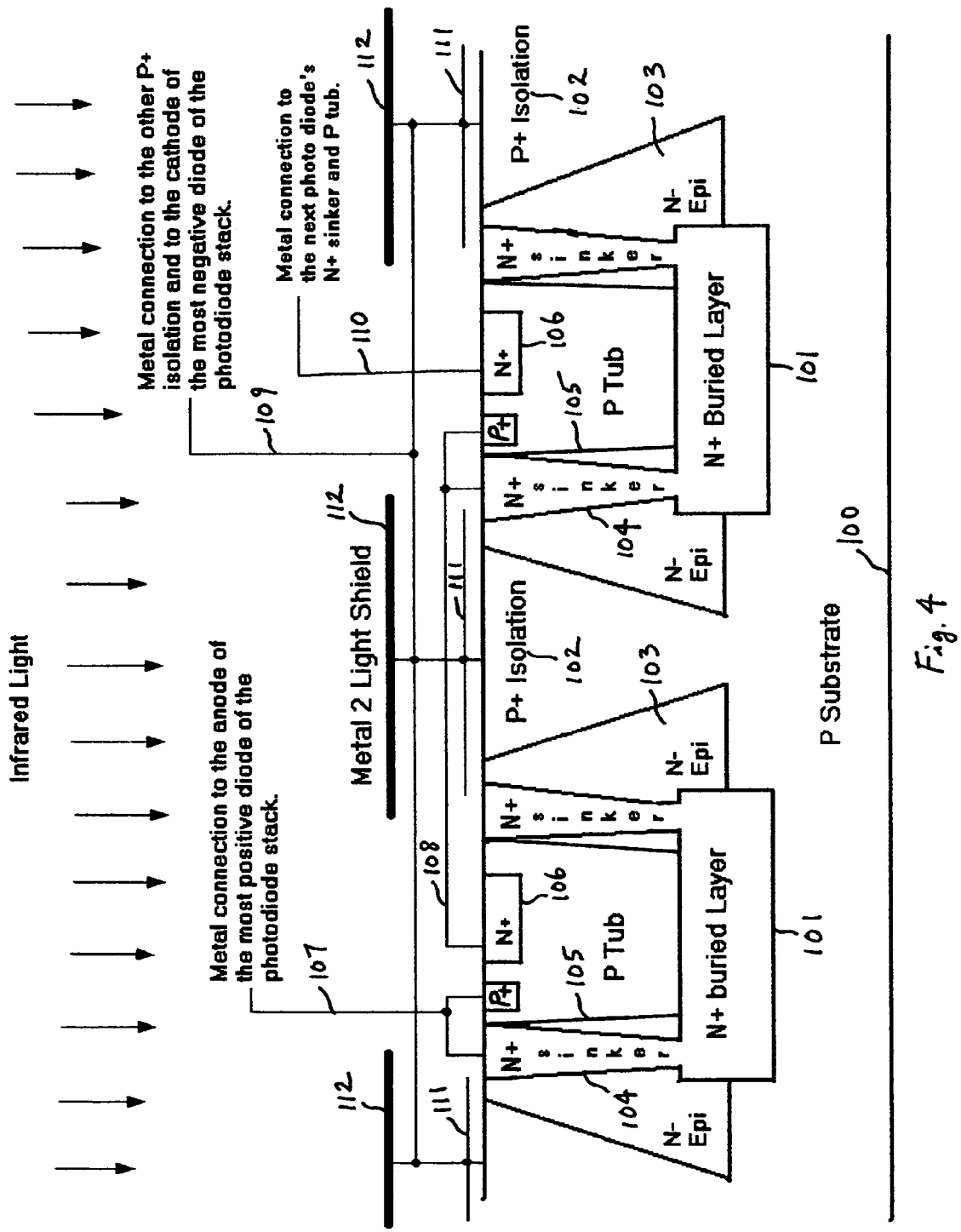
FIG. 4 is the cross section view of the first embodiment of the present invention of photodiode stack using junction isolated technology.

FIG. 4 is a cross section view of the first embodiment of the invention. The drawing depicts the diode structure and the interconnections of the top two diodes in the photodiode stack. In order to clearly show the metal connections within a photo diode, metal connections between the photo diodes, substrate ties and metal shielding connections, the top silicon dioxide layer is purposely left off the drawing.

The construction of the photo diode starts with a P substrate 100. N+ buried layer 101 is deposited at the locations where photo diodes are formed. Then a N− epi layer 103 is grown on top of the P substrate 100. A P+ isolation 102 diffusion is performed to form the individual N− epi 103 pockets for the photo diodes. Inside each of the N− epi pocket 103, a N+ sinker diffusion 104 is performed to connect down to the N+ buried layer 101. Next, a P tub 105 diffusion is performed into the epi 103 surrounded by the N+ sinker 104. The P tub 105 acts as the anode of the photo diode. A P+ diffusion 113 is made in the P tub 105 for ohmic metal contact to the P tub. Finally, a N+ diffusion 106 is performed within the P tub 105 which acts as the cathode of the photo diode.

As shown in FIG. 4, all of the P+ isolation 102 regions are connected by metal trace 109 to the cathode of the most negative diode of the photodiode stack. This connection ensures that there is reverse bias between the P substrate 100 and epi pocket 103 of the photo diodes. Metal trace 107 connects the N+ sinker 104 and the P tub 105 together which is the anode of the most positive diode of the photodiode stack. Metal trace 108 connects the N+ 106 which is the cathode of the most positive diode of the photodiode stack to the N+ sinker and P tub of the anode of the next diode down. Metal trace 110 connects the cathode of the second photo diode to the N+ sinker and P tub of the next diode down. This process repeats itself until it reaches the most negative diode of the photodiode stack. Metal light shields 111 and 112 cover and overlap the P+ isolation 102 areas to avoid photo current generation at the P+ isolation 102 and the N− epi junction 103.

Figure 5:
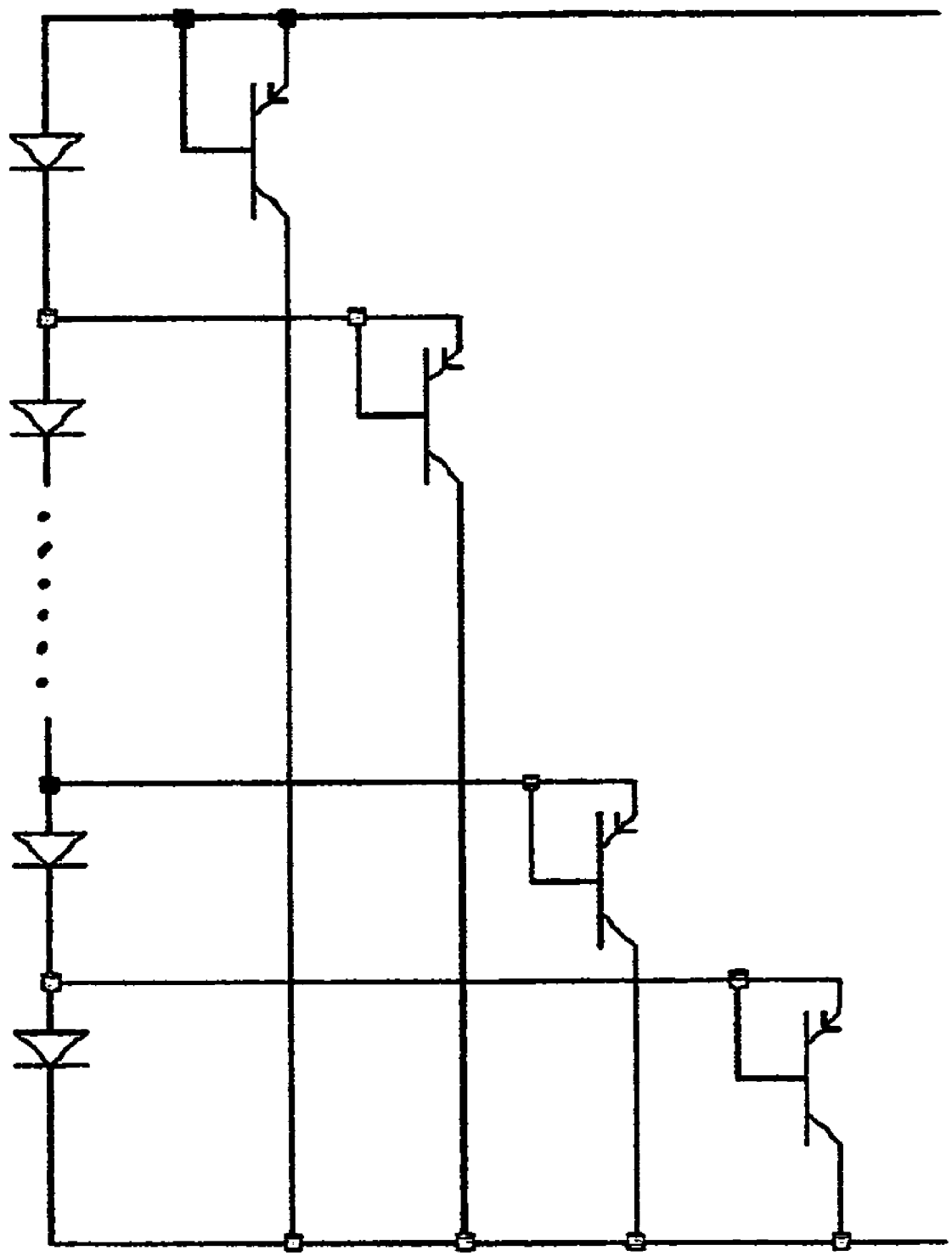
FIG. 5 is the circuit equivalent schematic of the first embodiment of the present invention of photodiode stack using junction isolated technology.

FIG. 5 shows the circuit schematic of the photodiode stack depicts in FIG. 4. As shown in the circuit schematic, there is a parasitic PNP transistor associated with the anode of each of the photo diode in the stack. The emitter of the PNP is the P tub 105 in FIG. 4. The base of the PNP is formed by the N+ sinker 104, N+ buried layer 101 and the N− epi 103. The collector of the PNP is the P substrate 100. As described in the previous paragraph, the N+ sinker 104 is connected to the P tub 105 by metal. So, the PNP is disabled since its emitter is shorted to its base. However, there is a base collector junction of the PNP connects to the anode of each of the photo diode which can generate thermal junction leakage current. For the photodiode stack voltage to rise in the present of infrared light, the photo current generates in each of the photo diode must be higher than the leakage current at the anode of each photo diode. The leakage current at the anode of each photo diode consists of three components. They are thermal junction leakage current, photo current generates at the P+ isolation and N− epi junction, and deep junction photo current generation at the bottom of the N− epi pocket and the P substrate.

The amplitude of the thermal junction leakage current it depending on the junction surface area, doping concentration of the PN junction and temperature. For an epi pocket dimension of 300 uM in width, 30 uM in length and 20 uM deep, the thermal junction leakage current is about 2 pA at room temperature. Thermal junction leakage typically doubles every 10 degree C. So, at 125 C, the thermal junction leakage current is about 2 nA. The photo current generated by a photo diode with the same epi pocket size is about 2 uA at room and 1 uA at 125 C for a LED current of 5 mA. Since the photo current magnitude is much higher than the thermal junction leakage current, thermal junction leakage current is not a concern in producing photodiode stack with junction isolation technology.

Photo current generates at the P+ isolation 102 and the N− epi 103 junction can interfere with the proper operation of the photodiode stack. To avoid photo current generation at the P+ isolation and the N− epi junction, metal1 layer light shield 111 and metal2 layer light shield 112 as shown in FIG. 4 are used to cover and overlap the P+ isolation regions.

Deep junction photo current generation at the bottom of the N− epi pocket and the P substrate cannot be avoided since the light path which generates the deep junction photo current is the same as the light path which generates the normal photo current of the photo diode. The active region for normal photo current generation is in the P tub 105 as shown in FIG. 4. Silicon is sensitive and can be useful as a photo detector at light with wavelength range from about 750 nM to 950 nM. Light penetration depth into silicon material is a function of its wavelength where longer wavelength light penetrates deeper into the silicon. The light wavelength vs penetration depth information can be found in technical journals and textbooks. An important fact is that light energy decays exponentially as it penetrates into the silicon. The light penetration depth value into silicon normally found in the technical journals and textbooks represents the silicon depth which the light energy is about 36% of its original value. By having a N− epi layer 103 thickness of 1.5× to 2× of the penetration depth value matching to the wavelength of the input infrared LED, the deep junction photo current will be about 15% to 22% of the photo current generates by the photo diode.

Figure 6:
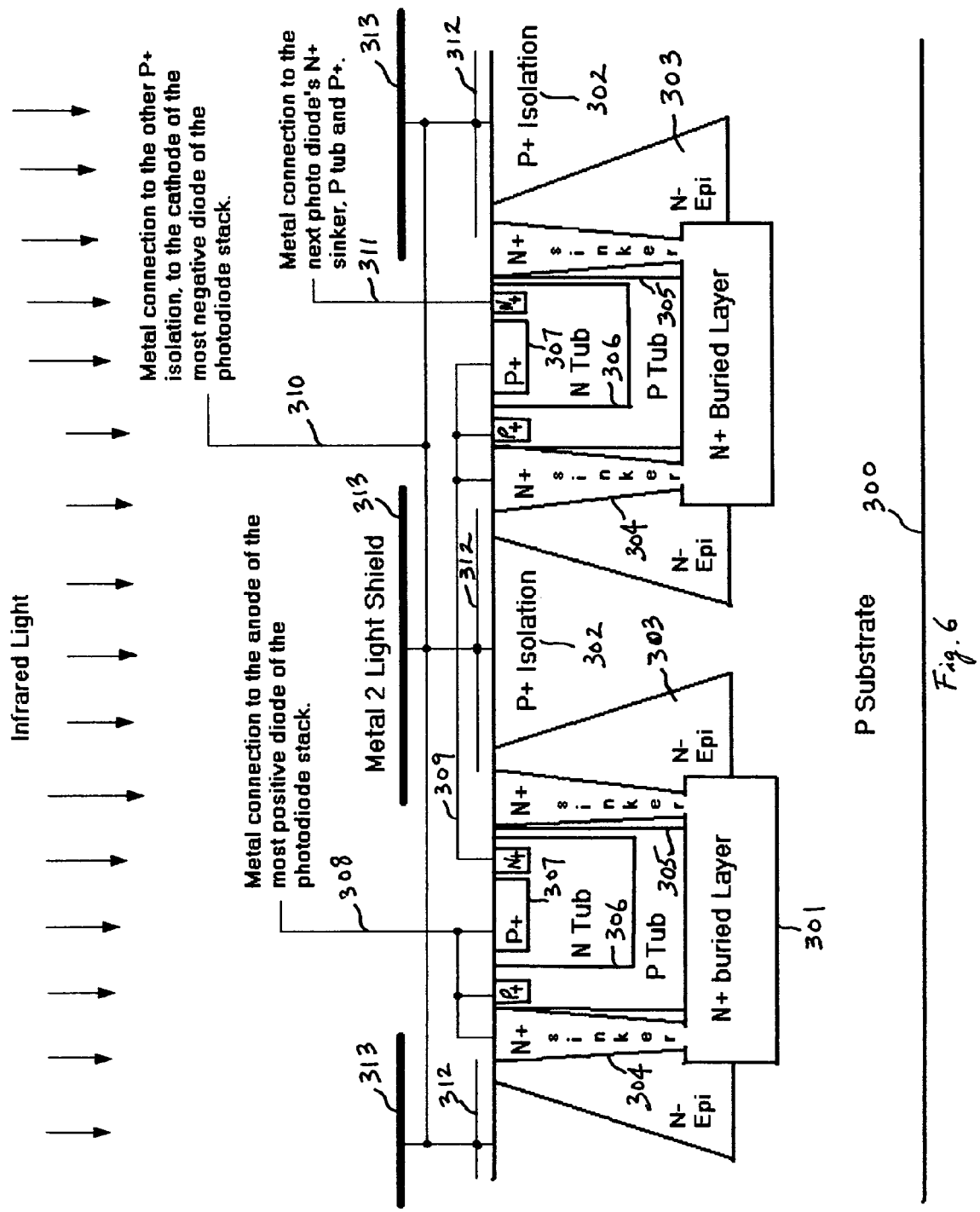
FIG. 6 is the cross section view of the second embodiment of the present invention of photodiode stack using junction isolated technology.

FIG. 6 is another embodiment of the photodiode stack design using junction isolation technology. The drawing depicts the photo diode structure and the interconnections of the top two diodes in the photodiode stack. In order to clearly show the metal connections within a photo diode, interconnection between the diodes, substrate ties and metal shielding connections, the top silicon dioxide layer is purposely left off the drawing.

The construction of the photo diode starts with a P substrate 300 material. N+ buried layer 301 is deposited at the locations where photo diodes are formed. A N− epi layer 303 is grown on top of the P substrate 300. A P+ isolation 302 is performed to form the individual N− epi pocket 303 for the photo diodes. Inside each of the N− epi pocket 303, a N+ sinker diffusion 304 is performed to connect down to the N+ buried layer 301. Next, a P tub 305 diffusion is performed into the epi 303 surrounded by the N+ sinker 304. A N tub diffusion 306 is performed inside the P tub 305. Finally a P+ diffusion 307 is performed inside the N tub 306. In this embodiment, the P+ diffusion 307 and the P tub 305 are the anode of the photo diode while the N tub 306 is the cathode of the photo diode. A P+ diffusion 314 and a N+ diffusion are formed in the P tub 305 and the N tub 306 for making metal ohmic contacts to the tubs. The active region where hole electron pair is generated is in the N tub 306 and P tub 305. Since the N tub 306 is sandwiched between the P+ diffusion 307 and the P tub 305, it increases the chance for hole and electron collection resulting in higher photo current generation with this photo diode structure.

As shown in FIG. 6, all of the P+ isolation 302 regions are connected by metal trace 312 to the cathode of the most negative diode of the photodiode stack. This connection ensures that there is reverse bias between the P substrate 300 and the epi pocket 303 of the photo diodes. Metal trace 308 connects the N+ sinker 304, P tub 305 and the P+ diffusion 307 together which is the anode of the most positive diode of the photodiode stack. Metal trace 309 connects the N tub 306 which is the cathode of the most positive diode of the photodiode stack to the N+ sinker, P tub and P+ diffusion of the anode of the next diode down. Metal trace 311 connects the cathode of the second photo diode to the N+ sinker, P tub and P+ diffusion of the next diode down the stack. This process repeats itself until it reaches the most negative diode of the photodiode stack. Metal1 layer light shield 312 and metal2 layer light shield 313 cover and overlap the P+ isolation 302 areas to avoid photo current generation at the P+ isolation 302 and the N– epi junction 303.

What is claimed is:

1. A photodiode stack device comprising of more than 3 photodiodes connected in series using junction isolation technology:
   (a) P+ isolation diffusions into a N– epi layer forming N– epi pockets on top of a P substrate where a photodiode will be formed in each of said N– epi pockets;
   (b) N+ buried layer at the bottom of said N– epi pocket and N+ sinker ring diffusion in said N– epi pocket produces a low resistive path in said N– epi pocket;
   (c) P tub diffusion into said N– epi pocket inside said N+ sinker ring;
   (d) N+ diffusion inside said P tub diffusion to form the cathode of said photodiode;
   (e) said P tub diffusion and said N+ sinker are connected by metal trace to form the anode of said photodiode;
   (f) said cathode of said photodiode is connected by metal trace and routed to the P tub and N+ sinker of the next diode of said photodiode stack;
   (g) metal connections are made to said P+ isolation diffusions and routed to the cathode of the most negative photodiode of said photodiode stack, whereby ensuring that said P+ isolations are reverse bias against said N– epi pockets;
   (h) metal light shield to connect, cover, and overlap said P+ isolation regions and route to said cathode of said most negative photodiode of said photodiode stack;
   (i) junction thickness of said N– epi to be substantially the same or larger than the penetration depth of the light exposure on said photodiode stack.

* * * * *